United States Patent
Cao et al.

(10) Patent No.: US 9,590,138 B2
(45) Date of Patent: Mar. 7, 2017

(54) GAN BASED LED EPITAXIAL STRUCTURE AND METHOD FOR MANUFACTURING THE SAME

(71) Applicant: Fujian Institute of Research on the Structure of Matter, Chinese Academy of Sciences, Fujian (CN)

(72) Inventors: Yongge Cao, Fujian (CN); Zhuguang Liu, Fujian (CN); Zhonghua Deng, Fujian (CN); Jian Chen, Fujian (CN); Junting Li, Fujian (CN); Binjie Fei, Fujian (CN); Wang Guo, Fujian (CN); Fei Tang, Fujian (CN); Qiufeng Huang, Fujian (CN); Xuanyi Yuan, Fujian (CN)

(73) Assignee: FUJIAN INSTITUTE OF RESEARCH ON THE STRUCTURE OF MATTER, CHINESE ACADEMY OF SCIENCES, Fujian (CN)

(*) Notice: Subject to any disclaimer, the term of this patent is extended or adjusted under 35 U.S.C. 154(b) by 0 days.

(21) Appl. No.: 14/335,678

(22) Filed: Jul. 18, 2014

(65) Prior Publication Data
US 2015/0021547 A1    Jan. 22, 2015

(30) Foreign Application Priority Data

Jul. 22, 2013 (CN) .......................... 2013 1 0307321
Jun. 27, 2014 (CN) .......................... 2014 1 0299430

(51) Int. Cl.
*H01L 29/06* (2006.01)
*H01L 33/06* (2010.01)
(Continued)

(52) U.S. Cl.
CPC ............ *H01L 33/06* (2013.01); *H01L 33/007* (2013.01); *H01L 33/0025* (2013.01);
(Continued)

(58) Field of Classification Search
CPC ..... H01L 33/06; H01L 33/32; H01L 33/0025; H01L 33/02; H01L 33/007; H01L 33/502
(Continued)

(56) References Cited

U.S. PATENT DOCUMENTS 6,630,691 B1* 10/2003 Mueller-Mach ........ H01L 33/08
257/103

* cited by examiner

*Primary Examiner* — Hung Vu
(74) *Attorney, Agent, or Firm* — Christensen, Fonder, Dardi & Herbert PLLC

(57) ABSTRACT

A GaN based LED epitaxial structure and a method for manufacturing the same. The GaN based LED epitaxial structure may include: a substrate; and a GaN based LED epitaxial structure grown on the substrate, wherein the substrate is a substrate containing a photoluminescence fluorescent material. The photoelectric efficiency of the LED epitaxial structure is enhanced and the amount of heat generated from a device is reduced by utilizing a rare earth element doped $Re_3Al_5O_{12}$ substrate; since the LED epitaxial structure takes a fluorescence material as a substrate, a direct white light emission may be implemented by such an LED chip manufactured by the epitaxial structure, so as to simplify the manufacturing procedure of the white light LED light source and to reduce production cost. The defect density of the epitaxial structure is reduced by firstly epitaxial growing, patterning the substrate and then laterally growing a GaN based epitaxial structure.

19 Claims, 3 Drawing Sheets

| 3017 Heavily doped p-type GaN electrode contact layer |
|---|
| 3016 P-type GaN layer |
| 3015 InGaN/GaN multi quantum well layer |
| 3014 N-type GaN layer |
| 3013 High temperature GaN buffer layer |
| 3012 Low temperature GaN buffer layer |
| 3011 Low temperature AlN buffer layer |
| 300 Re:YAG transparent ceramic or single crystalline substrate |

(51) Int. Cl.
 *H01L 33/00* (2010.01)
 *H01L 33/32* (2010.01)
 *H01L 33/02* (2010.01)
 *H01L 33/50* (2010.01)
(52) U.S. Cl.
 CPC .............. *H01L 33/02* (2013.01); *H01L 33/32* (2013.01); *H01L 33/502* (2013.01)
(58) Field of Classification Search
 USPC ............................................. 257/13; 438/47
 See application file for complete search history.

GAN BASED LED EPITAXIAL STRUCTURE AND METHOD FOR MANUFACTURING THE SAME

CROSS-REFERENCE TO RELATED APPLICATION(S)

This application claims priority to a Chinese Application No. 201310307321.1 filed on Jul. 22, 2013 and entitled "WHITE LIGHT LED EPITAXIAL STRUCTURE AND METHOD FOR MANUFACTURING THE SAME" and a Chinese Application No. 201410299430.8 filed on Jun. 27, 2014 and entitled "GAN BASED LED EPITAXIAL STRUCTURE AND METHOD FOR MANUFACTURING THE SAME", both of which are incorporated herein by reference in their entirety.

TECHNICAL FIELD

The present invention relates to a field of semiconductor optoelectronic device, in particular to a GaN based LED epitaxial structure and a method for manufacturing the same.

BACKGROUND

A light Emitting Diode (LED) may directly convert the electronic energy into optical energy. A LED chip is constituted of two portions, one of which is a P-type semiconductor in which a hole dominates and the other of which is an N-type semiconductor in which an electron dominates. When these two semiconductors are connected to each other, a "P-N junction" is formed between them. When a current is applied across the chip by a wire, the electrons are pushed towards the P region in which the electrons recombines with the holes to radiate energy in a form of photons. This is the principle of emission of LED.

As a novel light source, LED experiences an unprecedented development since its inapproachable advantages over conventional light sources, such as power saving, environmental, long life time, rapid start-up speed and capability of inhibiting sizes of the luminescent spectrum and the forbidden band width so that colors are rich. At present, the white LEDs are widely used in the field of illumination. In general, there are two major means for generating a white light, one of which utilizes three monochrome diodes which emit red, green and blue lights respectively to be mixed to generate a white light, the other of which utilizes a luminescent material to convert the monochrome light emitted by a blue or ultraviolet LED to a white light with a wide spectrum. The white light generated by the first means is mainly applied for a large screen display and that generated by the second means is mainly applied for illumination and a backlight source.

For the latter one, a Japanese company of Nichia possesses a groundbreaking invention (U.S. Pat. No. 5,998,925A), which utilizes a Blue GaN chip to excite a YAG yellow phosphor powder to obtain a white light. The inventive point of such a patent focus on a Yttrium Aluminum Garnet (YAG) phosphor which absorbs a blue light with a wavelength ranging from 450 nm to 470 nm and emits a yellow light with a wavelength ranging from 550 nm to 560 nm, and has an advantage of low cost and a high efficiency. For a normal blue or ultraviolet Led chip, its optoelectronic converting efficiency is generally lower than 30%. Even for the currently best LED chip, its optoelectronic converting efficiency is not higher than 50%. Thus, the LED emitting light accompanies with a lot of heat. At the position surrounding the lighten chip, the temperature will reach 150 to 200° C. Such a temperature may leads to a decrease of 20-30% for the efficiency of the phosphor, which in turn generates a shift of the color temperature for the light source with respect to the color coordinate, and affects the luminous efficiency and stability of the LED light source. The Yttrium Aluminum Garnet (YAG) phosphor degrades at a temperature above 120° C. Since the coated phosphor material is an opaque material, there is a scattering absorption when the light emitted by the blue or ultraviolet chip passes through the YAG phosphor, which leads to a lower emitting efficiency. Due to the uneven thickness of the coating, it seriously affects the light spot and the color temperature of the white light. For example, there are problems such as a yellow aperture, a blue light spot and inconsistency of the color temperature of the white light.

At present, the GaN based LED epitaxial wafer mostly utilizes a sapphire as the material for the substrate. Although the sapphire has a crystalline structure identical to that of GaN (hexago symmetrical wurtzite crystalline structure), it has a large lattice mismatch with the GaN material, i.e. up to 13%, which leads to a high dislocation density in the GaN epitaxial layer up to $10^8$-$10^9$/cm$^2$. The high dislocation density causes a decrease of luminous efficiency and leads to a mass of thermal dissipation, thereby causing light attenuation of the chip.

SUMMARY

The object of the present disclosure is to overcome the problems of the prior art LED, such as a lower optoelectronic converting efficiency, a large heat generation, a large lattice mismatch between the sapphire substrate and the GaN material and a high dislocation density.

The present disclosure seeks to solve all of the above mentioned problems of the prior at. The present disclosure provides a GaN based white light LED epitaxial wafer grown on a rare earth element doped Yttrium Aluminum Garnet series of ceramic or single crystal substrate without utilizing a phosphor powder. Meanwhile, the present disclosure provides a process for growing such an epitaxial wafer.

According to one aspect of the present disclosure, there is provided a GaN based LED epitaxial structure comprising: a substrate; a GaN based LED epitaxial structure grown on the substrate, wherein the substrate is a substrate containing a photoluminescence fluorescent material.

According to another aspect of the present disclosure, there is provided a method for manufacturing the GaN based LED epitaxial structure, comprising steps of: preparing a substrate containing a photoluminescence fluorescent material; and epitaxial growing a GaN based LED epitaxial structure grown on the substrate.

Preferably, the substrate may comprise a rare earth element doped Yttrium Aluminum Garnet series $Re_3Al_5O_{12}$ substrate.

Preferably, the substrate may comprise a substrate obtained by bonding the rare earth element doped $Re_3Al_5O_{12}$ substrate with an $Al_2O_3$ substrate.

Preferably, the rare earth element doped $Re_3Al_5O_{12}$ substrate may comprise a $Re_3Al_5O_{12}$ ceramic substrate or single crystal substrate. Preferably, the rare earth element doped ceramic substrate may comprise a polycrystalline $Re_3Al_5O_{12}$ ceramic substrate or a textured $Re_3Al_5O_{12}$ ceramic substrate.

Preferably, the substrate may comprise a substrate with a surface roughness lower than 10 nm which is obtained by a fine polishing.

Preferably, the GaN based LED epitaxial structure may comprise in turn a low temperature AlN buffer layer, a low temperature GaN buffer layer, a GaN buffer layer, an n-type GaN layer, an AlGaN barrier layer, an InGaN/GaN multi quantum well lighting layer, an AlGaN barrier layer, a P type GaN layer and a heavily doped P type GaN electrode contact layer.

Preferably, the rare earth element may comprise a material selected from a group consisting of Ce, Gd, Eu, Er, Nd, Tb, Sm, Tm, Dy and Yb, or combinations thereof.

Preferably, the GaN based LED epitaxial structure may comprise a GaN based LED epitaxial structure which is laterally epitaxial grown on a patterned rare earth element doped $Re_3Al_5O_{12}$ ceramic substrate, a single crystalline substrate or a bonded substrate.

The basic idea of the present invention is to utilize a rare earth element doped $Re_3Al_5O_{12}$ ceramic or single crystalline substrate as the substrate on surface of which a GaN based blue light LED epitaxial structure is grown, so that the blue light excites the ceramic or single crystalline fluorescent material substrate to mix into a white light. The present invention impellents a growth of a GaN based white light LED epitaxial wafer with avoiding use of the phosphor powder in the conventional white light LED, so as to effectively avoid a decrease of quantum efficiency of the phosphor powder and shift of the color temperature and the color coordinate of the light source caused by high temperature. Meanwhile, it simplifies the production routine of the white light LED and greatly reduces the production cost of the white light LED.

The photoelectric efficiency of the LED epitaxial structure is enhanced and the amount of heat generated from a device is reduced by utilizing a rare earth element doped $Re_3Al_5O_{12}$ substrate; since the LED epitaxial structure takes a fluorescence material as a substrate, a direct white light emission may be implemented by such a LED chip manufactured by the epitaxial structure, so as to simplify the manufacturing procedure of the white light LED light source and to reduce the production cost. The defect density of the epitaxial structure is reduced by firstly epitaxial growing, patterning the substrate and then laterally growing a GaN based epitaxial structure.

BRIEF DESCRIPTION OF THE DRAWINGS

The advantages of such an invention is more apparent from the following illustration by reference to the accompany figures, in which.

DETAILED DESCRIPTION

Figure 1:
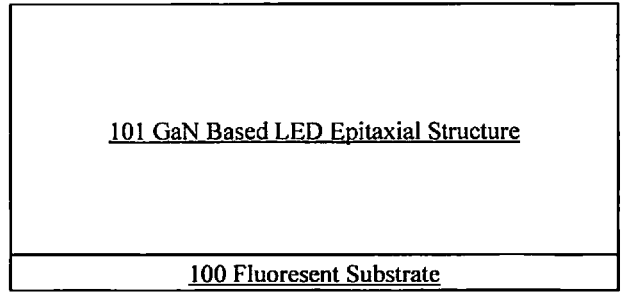
FIG. 1 is a schematic view of the GaN based LED epitaxial structure according to an embodiment of the present invention.

Exemplary embodiments of the present disclosure will be described in more details below with reference to the accompanying drawings. In the drawings, like reference numerals denote like members. The figures are not drawn to scale, for the sake of clarity. For the sake of clarity, various components in the attached drawings are not drawn to scale.

Some particular details of the present disclosure will be described below, such as exemplary structures, materials, dimensions, process steps and technologies of the semiconductor device, for better understanding of the present disclosure. However, it can be understood by one skilled person in the art that these details are not always essential for but can be varied in a specific implementation of the disclosure.

It should be understood that when one layer or region is referred to as being "above" or "on" another layer or region in the description of device structure, it can be directly above or on the other layer or region, or other layers or regions may be intervened therebetween. Moreover, if the device in the figures is turned over, the layer or region will be "under" or "below" the other layer or region. In order to illustrate a situation in which one layer or region is directly positioned to the other layer or region, one layer is referred to as being "directly on" or "on and adjacent to" in the present description.

In the present application, the term "semiconductor structure" means generally the whole semiconductor structure formed at each step of the method for manufacturing the semiconductor device, including all of the layers and regions having been formed. Some particular details of the present disclosure will be described below, such as exemplary semiconductor structures, materials, dimensions, process steps and technologies of the semiconductor device, for better understanding of the present disclosure. However, it can be understood by one skilled person in the art that these details are not always essential for but can be varied in a specific implementation of the disclosure.

Unless the context clearly indicates otherwise, each part of a semiconductor device can be made of material(s) well-known to one skilled person in the art. The present invention can be illustrated in various of forms, some of which would be described in the following.

FIG. 1 shows a schematic view of the GaN based white light LED epitaxial structure according to an embodiment of the present invention. As shown in FIG. 1, the GaN based LED epitaxial structure may comprise: a substrate 100; a GaN based LED epitaxial structure 101 grown on the substrate, wherein the substrate is a substrate containing a photoluminescence fluorescent material.

In particularly, the substrate may comprise a rare earth element doped Yttrium Aluminum Garnet series $Re_3Al_5O_{12}$ substrate. The rare earth element doped $Re_3Al_5O_{12}$ substrate may comprise a $Re_3Al_5O_{12}$ ceramic substrate or single crystalline substrate. The rare earth element doped ceramic substrate may comprise a polycrystalline $Re_3Al_5O_{12}$ ceramic substrate or a textured $Re_3Al_5O_{12}$ ceramic substrate. The substrate may comprise a substrate with a surface roughness lower than 10 nm which is obtained by a fine polishing. The rare earth element may comprise a material selected from a group consisting of Ce, Gd, Eu, Er, Nd, Tb, Sm, Tm, Dy and Yb, or combinations thereof. In particularly, the doping amount is about 0.005 we %-25 wt. %. By utilizing a rare earth element doped YAG substrate, the photoelectric efficiency of the LED epitaxial efficiency is enhanced and the amount of generated heat is decreased.

Figure 2:
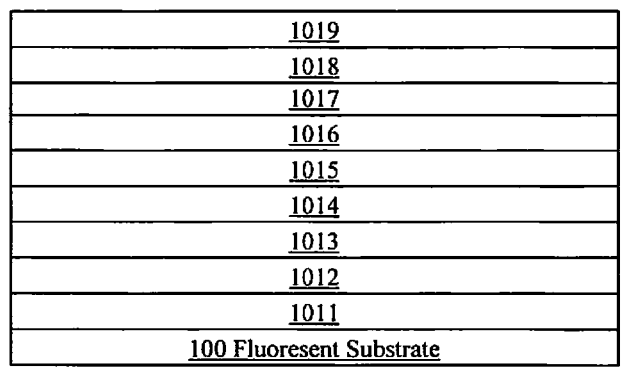
FIG. 2 is a detailed schematic view of the GaN based LED epitaxial structure according to an embodiment of the present invention.

FIG. 2 shows a schematic view of the GaN based LED epitaxial structure according to an embodiment of the present invention. In particularly, the GaN based LED epitaxial structure may comprise, on a substrate, in turn a low temperature AlN buffer layer 1011, a low temperature GaN buffer layer 1012, a GaN buffer layer 1013, an n-type GaN layer 1014, an AlGaN barrier layer 1015, an InGaN/GaN multi quantum well lighting layers 1016, an AlGaN barrier layer 1017, a P type GaN layer 1018 and a heavily doped p-type GaN electrode contact layer 1019.

Figure 3:
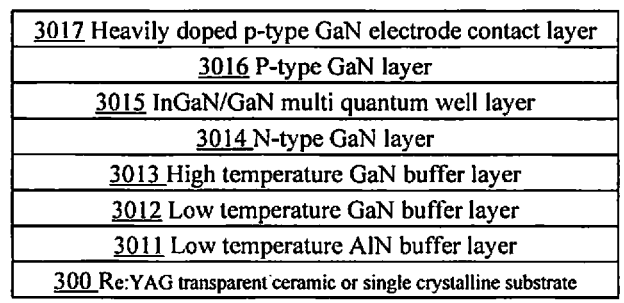
FIG. 3 is another schematic view of the GaN based LED epitaxial structure according to an embodiment of the present invention.

FIG. 3 shows a schematic view of another GaN based LED epitaxial structure. In particularly, the GaN based LED epitaxial structure may comprise, on a transparent Re:YAG ceramic or single crystalline substrate 300, in turn a low temperature AlN buffer layer 3011, a high temperature AlN buffer layer 3012, a high temperature GaN buffer layer 3013, an N-type GaN layer 3014, InGaN/GaN multi quantum well layers 3015, InGaN/GaN multi quantum well layers 3016 and a heavily doped P type GaN electrode contact layer 3017.

The substrate may comprise a substrate obtained by bonding the rare earth element doped $Re_3Al_5O_{12}$ substrate with an $Al_2O_3$ substrate. The bonding may be implemented as follows. A rare earth element doped $Re_3Al_5O_{12}$ ceramic substrate or single crystalline substrate is polished to be with a surface roughness less than 10 nm, and an $Al_2O_3$ single crystalline substrate is polished to be with a surface roughness less than 10 nm. The surface of the polished $Re_3Al_5O_{12}$ ceramic substrate or single crystalline substrate and that of the polished $Al_2O_3$ single crystalline substrate are cleaned by a RCA or Piranha standard cleaning procedure and then are dried in vacuum. On the basis of cleaning and drying, alternatively, the surface of the cleaned and polished $Re_3Al_5O_{12}$ ceramic substrate or single crystalline substrate and that of the polished $Al_2O_3$ single crystalline substrate are cleaned by a Ar sputtering in a vacuum atmosphere with a vacuity less than $1\times10^{-3}$ Pa. Then, the surface of the cleaned and polished YAG ceramic substrate or single crystalline substrate and that of the polished $Al_2O_3$ single crystalline substrate are jointed at a normal pressure or in a vacuum atmosphere with a vacuity less than $1\times10^{-3}$ Pa for about 20 seconds to 2 hours. The temperature at the binding surface is about 200-1500° C. Thus, the bonding is implemented at such a condition. The bonded wafer is annealed at a temperature of about 200-1500° C. for an annealing period of about 30 minutes to 10 hours. The rare earth element doped YAG substrate is bonded to the $Al_2O_3$ substrate and then an epitaxial structure is grown on it.

In particularly, the GaN based LED epitaxial structure may comprise a GaN based LED epitaxial structure which is laterally epitaxial grown on a patterned rare earth element doped $Re_3Al_5O_{12}$ ceramic substrate, a single crystalline substrate or a bonded substrate. The steps for laterally growing an epitaxial structure on a patterned substrate are shown as follows. A GaN epitaxial layer is grown by utilizing a Low Pressure-Metal Organic Compound Vapor Deposition (LP-MOCVD) system, in which a TMGa and NH3 are used as the Gallium source and the Nitrogen source, respectively, and the $H_2$ is used as the carrier gas. The substrate is thermally processed at a temperature of about 1000-1200° C. for about 5-10 minutes. Then the substrate is cooled down to a temperature of about 400-700° C. and processed in nitrogen gas atmosphere to grow a low temperature GaN buffer layer having a thickness of about 15-60 nm on it. Next, the substrate is heated up to a temperature of about 1000-1200° C. and a GaN buffer layer having a thickness of about 100 nm-4 μm is grown on it. Next, the substrate is selectively heated up to a temperature of about 1000-1200° C. and a n-type GaN layer having a thickness of about 10 nm-500 nm is grown on it, in which the doping concentration of Si is about $1\times10^{17}$ cm$^{-3}$-$3\times10^{20}$ cm$^{-3}$. The system is cooled down and the sample is taken out. Next, a $SiO_2$ layer having a thickness of about 50-500 nm is deposited on the surface of the GaN layer by a Plasma Enhanced Chemical Vapor Deposition (PECVD) and functions as a mask layer. Next, a long stripe window with a length of about 2-15 μm and a ratio between the window region and mask region of about 1:4-4:1 is etched on the GaN surface along the crystallographic direction by a conventional photolithographic process in conjunction with a dry or wet etching technique. Next, the patterned substrate is clean and dried by a general cleaning procedure in the field for manufacturing a semiconductor device. Next, the cleaned, dried and patterned substrate is placed into the epitaxial growing system and a subsequent epitaxial structure continues to be grown on it. The defect density of the epitaxial structure may be decreased by epitaxial growing an epitaxial structure, patterning the substrate and then laterally epitaxial growing a GaN based epitaxial structure.

Figure 4:
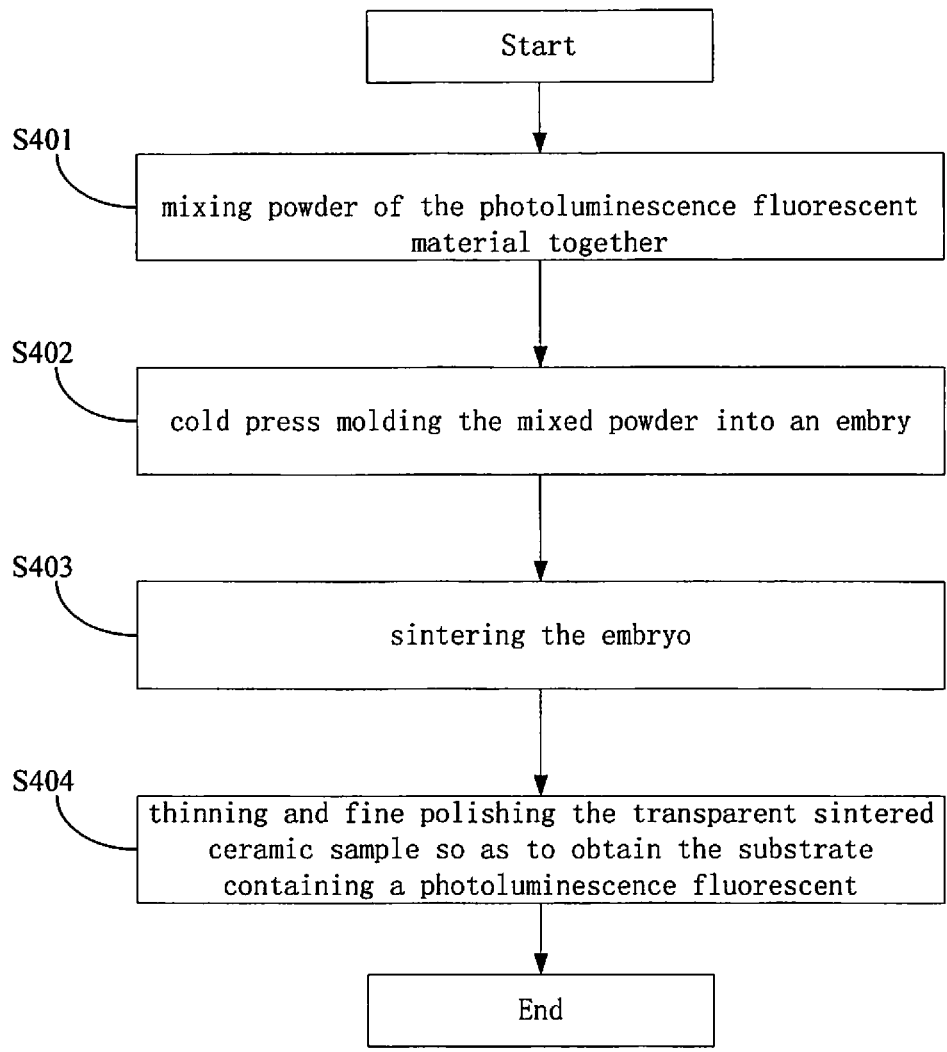
FIG. 4 is a flowchart of a method for manufacturing a substrate containing a photoluminescence fluorescent material.

FIG. 4 shows a method for manufacturing a substrate containing a photoluminescence fluorescent material. As shown in FIG. 4, the method may comprise steps of: mixing powder of the photoluminescence fluorescent material together (S401); cold press molding the mixed powder into an embryo (S402); sintering the embryo (S403); and thinning and fine polishing the transparent sintered ceramic sample (S404).

In particularly, the method may further comprise steps of: mixing a rare earth element oxide powder into a Yttrium Aluminum Garnet YAG powder in a certain proportion; completely mixing the powders by a wet ball milling; drying the powder to obtain a raw material of the fluorescence ceramic powder; cold press molding the fluorescence ceramic powder into an embryo; sintering the embryo in a vacuum sintering furnace at a high temperature; and thinning and fine polishing the transparent sintered ceramic sample.

In particularly, the rare earth element oxide may comprise an oxide of CeO and/ GdO.

After the step of cold press molding the mixed powder into an embryo, the method may further comprise steps of: placing the embryo into a single-crystal growth furnace at a vacuum and a high temperature; heating the furnace to melt the powder embryo; growing a crystal by a utilizing a YAG seed crystal according to a Czochralski crystal growth process; dicing the grown crystal into an epitaxial wafer; and thinning and fine polishing the epitaxial wafer.

Figure 5:
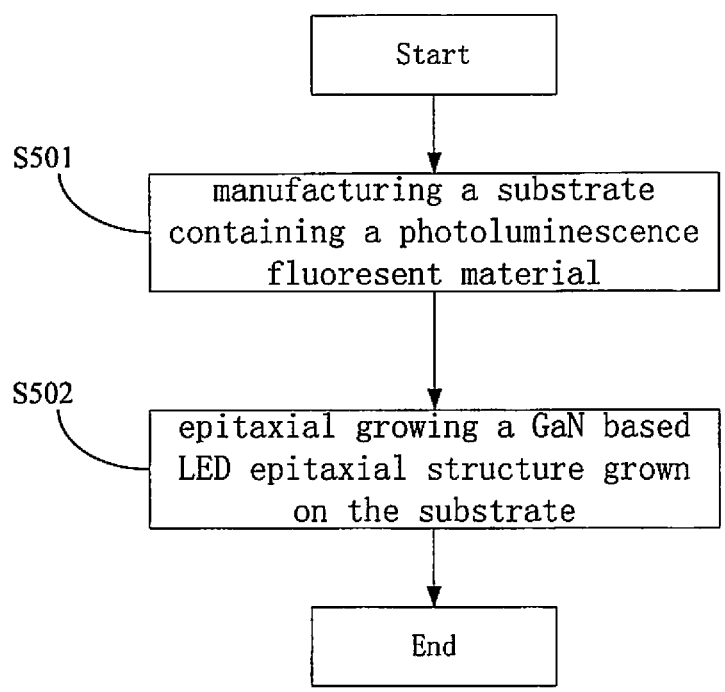
FIG. 5 is a flowchart of a method for manufacturing a GaN based LED semiconductor device.

FIG. 5 is a flowchart of a method for manufacturing a GaN based LED semiconductor device. The method may comprise steps of: preparing a substrate containing a photoluminescence fluorescent material (501); and epitaxial growing a GaN based LED epitaxial structure on the substrate 502).

In particularly, the substrate may comprise a rare earth element doped Yttrium Aluminum Garnet series $Re_3Al_5O_{12}$ substrate. The rare earth element doped $Re_3Al_5O_{12}$ substrate may comprise a $Re_3Al_5O_{12}$ ceramic substrate or single crystalline substrate. The rare earth element doped ceramic substrate may comprise a polycrystalline $Re_3Al_5O_{12}$ ceramic substrate or a textured $Re_3Al_5O_{12}$ ceramic substrate. The rare earth element may comprise a material selected from a group consisting of Ce, Gd, Eu, Er, Nd, Tb, Sm, Tm, Dy and Yb, or combinations thereof.

Prior to the step of epitaxial growing, the method may further comprise a step of bonding the rare earth element doped $Re_3Al_5O_{12}$ ceramic substrate to the $Al_2O_3$ substrate.

Prior to the step of epitaxial growing, the method may further comprise a step of fine polishing the prepared substrate so that the surface roughness of the substrate is lower than 10 nm. Preferably, the substrate may comprise a substrate with a surface roughness of about 0.1-0.3 nm which is obtained by a fine polishing.

The GaN based LED epitaxial structure may comprise, on a substrate, in turn a low temperature AlN buffer layer, a low temperature GaN buffer layer, a GaN buffer layer, an n-type GaN layer, an AlGaN barrier layer, InGaN/GaN multi quantum well lighting layers, an AlGaN barrier layer, a P type GaN layer and a heavily doped p-type GaN electrode contact layer. The GaN based LED epitaxial layer may be grown on different substrates. For example, the following steps are performed. First of all, the substrate is cleaned at a temperature of about 800-1400° C. and a $H_2$ atmosphere for about 5-20 minutes. The temperature decreases to about 500-700° C. and then a low temperature AlN buffer layer having a thickness of about 15-60 nm is grown; for a patterned substrate, the thickness of the lower temperature AlN buffer layer may be set to about 0-200 nm. The temperature is kept at about 500-700° C. and a low temperature GaN buffer layer having a thickness of about 50 nm-300 nm is grown; and for the patterned substrate, the thickness of the lower temperature GaN buffer layer may be set to about 50-800 nm. The temperature is raised up to about 900-1200° C. and a high temperature GaN buffer layer having a thickness of about 2-4 µm is grown. The temperature is raised up to about 900-1200° C. and an n-type GaN buffer layer having a thickness of about 1-3 µm is grown, in which the doping concentration of Si is about $1\times10^{17}$ $cm^{-3}$–$3\times10^{20}$ $cm^{-3}$. The temperature is decreased down to about 650-850° C. and InGaN/GaN multi quantum well layers are grown for about 1-30 cycles. The temperature is raised up to about 800-1150° C. and a p-type GaN layer having a thickness of about 100-800 nm is grown, in which the doping concentration of Si is about $1\times10^{17}$ $cm^{-3}$–$3\times10^{20}$ $cm^{-3}$. The temperature is raised up to about 800-1150° C. and a heavily doped p-type GaN electrode contacting layer having a thickness of about 5-50 nm is grown, in which the doping concentration of Mg is about $1\times10^{18}$ $cm^{-3}$–$5\times10^{20}$ $cm^{-3}$.

The method may further comprise steps of: patterning the rare earth element doped $Re_3Al_5O_{12}$ ceramic substrate, a single crystalline substrate or a bonded substrate; and laterally epitaxial growing a GaN based LED epitaxial structure on the patterned substrate.

The method for manufacturing a substrate containing a photoluminescence fluorescent material, the method for manufacturing a GaN based LED epitaxial structure and the resultant GaN based LED epitaxial structure will be illustrate by reference to the following particular embodiments.

According to one aspect of the present invention, a $Ce_2O_3$ powder with a ratio of 0.005 wt. % is mixed into a YAG powder and the powders are completely mixed by a wet ball milling. The powder is dried to obtain a raw material of the fluorescence ceramic powder. The fluorescence ceramic powder embryo is cold press moulded into an embryo. The embryo is transferred into a vacuum sintering furnace to be sintered at a temperature of about 1450° C. for about 10 hours. The transparent sintered ceramic sample is thinned and fine polished to have a thickness of about 600 µm and a surface roughness of about 3 nm. The transparent Ce:YAG ceramic material is used as a substrate, transferred into a Metal Organic Compound Vapor Deposition apparatus, and cleaned at a temperature of about 800° C. and a $H_2$ atmosphere for about 20 minutes. The temperature decreases to about 500° C. and then a low temperature AlN buffer layer having a thickness of about 15 nm is grown. A low temperature GaN buffer layer having a thickness of about 300 nm is grown. The temperature is raised up to about 900° C. and a high temperature GaN buffer layer having a thickness of about 2 µm is grown. The temperature is kept at about 900° C. and an n-type GaN layer having a thickness of about 3 µm is grown, in which the doping concentration of Si is about $1\times10^{17}$ $cm^{-3}$–$3\times10^{20}$ $cm^{-3}$. The temperature is decreased down to about 650° C. and InGaN/GaN multi quantum well layers are grown for 30 cycles. The temperature is raised up to about 800° C. and a p-type GaN layer having a thickness of about 100 nm is grown, in which the doping concentration is about $3\times10^{20}$ $cm^{-3}$. The temperature is kept at about 800° C. and a heavily doped p-type GaN electrode contacting layer having a thickness of about 50 nm is grown, in which the doping concentration of Mg is about $5\times10^{20}$ $cm^{-3}$. Finally, the deposition apparatus is cooled down to a room temperature. Thus, the GsN based LED epitaxial structure according to the present invention is obtained.

According to one aspect of the present invention, a $Ce_2O$ powder with a ratio of 0.3 wt. % is mixed into a YAG powder and the powders are completely mixed by a wet ball milling. The powder is dried to obtain a raw material of the fluorescence ceramic powder. The fluorescence ceramic powder is moulded by cold isostatic pressing into an embryo. The embryo is transferred into a vacuum sintering furnace to be sintered at a temperature of about 1850° C. for about 15 hours. The transparent sintered ceramic sample is thinned and fine polished to have a thickness of about 450 µm and a surface roughness of about 2 nm. The Ce:YAG ceramic material is used as a substrate, transferred into a Metal Organic Compound Vapor Deposition apparatus, and cleaned at a temperature of about 1400° C. and a $H_2$ atmosphere for about 20 minutes. The temperature decreases to about 700° C. and then a low temperature AlN buffer layer having a thickness of about 60 nm is grown. A low temperature GaN buffer layer having a thickness of about 50 nm is grown. The temperature is raised up to about 1200° C. and a high temperature GaN buffer layer having a thickness of about 4 µm is grown. The temperature is kept at about 1200° C. and an n-type GaN layer having a thickness of about 1 µm is grown, in which the doping concentration of Si is about $3\times10^{20}$ $cm^{-3}$. The temperature is decreased down to about 850° C. and InGaN/GaN multi quantum well layers are grown for 25 cycles. The temperature is raised up to about 1150° C. and a p-type GaN layer having a thickness of about 800 nm is grown, in which the doping concentration is about $3\times10^{20}$ $cm^{-3}$. The temperature is kept at about 1150° C. and a heavily doped p-type GaN electrode contacting layer having a thickness of about 5 nm is grown, in which the doping concentration of Mg is about $5\times10^{20}$ $cm^{-3}$. Finally, the deposition apparatus is cooled down to a room temperature. Thus, the GsN based LED epitaxial structure according to the present invention is obtained.

According to one aspect of the present invention, a $Ce_2O_3$ powder with a ratio of 1.2 wt. % and a $Gd_2O_3$ powder with a ratio of 25 wt. % are mixed into a YAG powder and the powders are completely mixed by a wet ball milling. The powder is dried to obtain a raw material of the fluorescence ceramic powder. The fluorescence ceramic powder is moulded by cold isostatic pressing into an embryo. The embryo is transferred into a vacuum sintering furnace to be sintered at a temperature of about 1830° C. for about 12 hours. The transparent sintered ceramic sample is thinned and fine polished to have a thickness of about 350 µm and a surface roughness of about 1 nm. The Ce:YAG ceramic material is used as a substrate, transferred into a Metal Organic Compound Vapor Deposition apparatus, and cleaned at a temperature of about 1300° C. and a H$_2$ atmosphere for about 15 minutes. The temperature decreases to about 500° C. and then a low temperature AlN buffer layer having a thickness of about 60 nm is grown. The temperature is raised to about 700° C. and a low temperature GaN buffer layer having a thickness of about 50 nm is grown. The temperature is raised up to about 1100° C. and a high temperature GaN buffer layer having a thickness of about 4 μm is grown. The temperature is kept at about 1200° C. and an n-type GaN layer having a thickness of about 1 μm is grown, in which the doping concentration of Si is about 1.5×10$^{19}$ cm$^{-3}$. The temperature is decreased down to about 850° C. and InGaN/GaN multi quantum well layers are grown for 30 cycles. The temperature is raised up to about 1050° C. and a p-type GaN layer having a thickness of about 500 nm is grown, in which the doping concentration is about 2×10$^{17}$ cm$^{-3}$. The temperature is raised up to about 1180° C. and a heavily doped p-type GaN electrode contacting layer having a thickness of about 25 nm is grown, in which the doping concentration of Mg is about 3×10$^{19}$ cm$^{-3}$. Finally, the deposition apparatus is cooled down to a room temperature. Thus, the GsN based LED epitaxial structure according to the present invention is obtained.

According to one aspect of the present invention, a Gd$_2$O$_3$ powder with a ratio of 0.005 wt. % is mixed into a YAG powder and the powders are completely mixed by a wet ball milling. The powder is dried to obtain a raw material of the fluorescence crystal powder. The raw material of the fluorescence crystal powder is cold press moulded into an embryo. The embryo is transferred into a vacuum single crystal growing furnace at a high temperature and the temperature is raised to melt the powder. Then, a crystal is grown by a Czochralski crystal growth process utilizing a YAG seed crystal. The grown crystal is diced into an epitaxial wafer; and thin and fine polished to have a thickness of about 600 μm and a surface roughness of about 3 nm. The Ce:YAG single crystal material is used as a substrate, transferred into a Metal Organic Compound Vapor Deposition apparatus, and cleaned at a temperature of about 800° C. and a H$_2$ atmosphere for about 20 minutes. The temperature decreases to about 500° C. and then a low temperature AlN buffer layer having a thickness of about 15 nm is grown. A low temperature GaN buffer layer having a thickness of about 300 nm is grown. The temperature is raised up to about 900° C. and a high temperature GaN buffer layer having a thickness of about 2 μm is grown. The temperature is kept at about 900° C. and an n-type GaN layer having a thickness of about 3 μm is grown, in which the doping concentration of Si is about 1×10$^{17}$ cm$^{-3}$. The temperature is decreased down to about 650° C. and InGaN/GaN multi quantum well layers are grown for 30 cycles. The temperature is raised up to about 800° C. and a p-type GaN layer having a thickness of about 100 nm is grown, in which the doping concentration is about 3×10$^{20}$ cm$^{-3}$. The temperature is kept at about 800° C. and a heavily doped p-type GaN electrode contacting layer having a thickness of about 50 nm is grown, in which the doping concentration of Mg is about 5×10$^{20}$ cm$^{-3}$. Finally, the deposition apparatus is cooled down to a room temperature. Thus, the GsN based LED epitaxial structure according to the present invention is obtained.

According to one aspect of the present invention, a composition of (Ce$_{0.01\%}$Y$_{99.94\%}$)$_3$Al$_5$O$_{12}$ is sintered as a ceramic. The sintered sample is polished to have a thickness of about 0.61 mm and a surface roughness of about 0.3 nm. The ceramic material is used as a substrate, transferred into a Metal Organic Compound Vapor Deposition apparatus, and cleaned at a temperature of about 800° C. and a H$_2$ atmosphere for about 20 minutes. The temperature decreases to about 500° C. and then a low temperature AlN buffer layer having a thickness of about 15 nm is grown. A low temperature GaN buffer layer having a thickness of about 300 nm is grown. The temperature is raised up to about 900° C. and a high temperature GaN buffer layer having a thickness of about 2 μm is grown. The temperature is kept at about 900° C. and an n-type GaN layer having a thickness of about 3 μm is grown, in which the doping concentration of Si is about 1×10$^{17}$ cm$^{-3}$. The temperature is decreased down to about 650° C. and InGaN/GaN multi quantum well layers are grown for 30 cycles. The temperature is raised up to about 800° C. and a p-type GaN layer having a thickness of about 100 nm is grown, in which the doping concentration is about 3×10$^{20}$ cm$^{-3}$. The temperature is kept at about 800° C. and a heavily doped p-type GaN electrode contacting layer having a thickness of about 50 nm is grown, in which the doping concentration of Mg is about 5×10$^{20}$ cm$^{-3}$. Finally, the deposition apparatus is cooled down to a room temperature. Thus, the GsN based white light LED epitaxial structure is obtained.

According to one aspect of the present invention, a composition of (Ce$_{0.06\%}$Y$_{99.94\%}$)$_3$Al$_5$O$_{12}$ is sintered as a ceramic. The sintered ceramic is thinned to have a thickness of about 0.6 mm and its surface is polished to have a surface roughness of about 0.3 nm. The commercially available Al$_2$O$_3$ single crystal is polished in both sides to have a surface roughness of about 0.5 nm at both sides. The Ce:YAG ceramic and the Al$_2$O$_3$ single crystal are cleaned in a standard RCA procedure and dried in vacuum. The surface of the dried Ce:YAG ceramic and that of the Al$_2$O$_3$ single crystalline are jointed together at the opposite polished surfaces in a ultra-clean chamber. Then the jointed surfaces are heated by heating equipment up to a temperature of about 1500° C. and are bonded for 20 seconds. The bonded substrate is transferred into a Metal Organic Compound Vapor Deposition apparatus, and cleaned at a temperature of about 800° C. and a H$_2$ atmosphere for about 20 minutes. The temperature decreases to about 500° C. and then a low temperature AlN buffer layer having a thickness of about 15 nm is grown. A low temperature GaN buffer layer having a thickness of about 300 nm is grown. The temperature is raised up to about 900° C. and a high temperature GaN buffer layer having a thickness of about 2 μm is grown. The temperature is kept at about 900° C. and an n-type GaN layer having a thickness of about 3 μm is grown, in which the doping concentration of Si is about 1×10$^{17}$ cm$^{-3}$. The temperature is decreased down to about 650° C. and InGaN/GaN multi quantum well layers are grown for 30 cycles. The temperature is raised up to about 800° C. and a p-type GaN layer having a thickness of about 100 nm is grown, in which the doping concentration is about 3×10$^{20}$ cm$^{-3}$. The temperature is kept at about 800° C. and a heavily doped p-type GaN electrode contacting layer having a thickness of about 50 nm is grown, in which the doping concentration of Mg is about 5×10$^{20}$ cm$^{-3}$. Finally, the deposition apparatus is cooled down to a room temperature. Thus, the GsN based white light LED epitaxial structure is obtained.

According to one aspect of the present invention, a composition of (Ce$_{0.01\%}$Y$_{99.94\%}$)$_3$Al$_5$O$_{12}$ is sintered as a textured (Ce$_{0.01\%}$Y$_{99.94\%}$)$_3$Al$_5$O$_{12}$ ceramic by a template method. The sintered sample is polished to have a thickness of about 0.58 mm and a surface roughness of about 0.3 nm. The ceramic material is used as a substrate and is transferred into a Metal Organic Compound Vapor Deposition apparatus, and cleaned at a temperature of about 900° C. and a H$_2$ atmosphere for about 40 minutes. The temperature decreases to about 500° C. and then a low temperature AlN buffer layer having a thickness of about 15 nm is grown. A low temperature GaN buffer layer having a thickness of about 300 nm is grown. The temperature is raised up to about 900° C. and a high temperature GaN buffer layer having a thickness of about 2 μm is grown. The temperature is kept at about 900° C. and an n-type GaN layer having a thickness of about 3 μm is grown, in which the doping concentration of Si is about $1\times10^{17}$ cm$^{-3}$. The temperature is decreased down to about 650° C. and InGaN/GaN multi quantum well layers are grown for 30 cycles. The temperature is raised up to about 800° C. and a p-type GaN layer having a thickness of about 100 nm is grown, in which the doping concentration is about $3\times10^{20}$ cm$^{-3}$. The temperature is kept at about 800° C. and a heavily doped p-type GaN electrode contacting layer having a thickness of about 50 nm is grown, in which the doping concentration of Mg is about $5\times10^{20}$ cm$^{-3}$. Finally, the deposition apparatus is cooled down to a room temperature. Thus, the GsN based white light LED epitaxial structure is obtained.

According to one aspect of the present invention, a composition of $(Ce_{0.06\%}Gd_{25\%}Y_{74.94\%})_3Al_5O_{12}$ is sintered as a ceramic by. The sintered ceramic sample is thinned and polished to have a thickness of about 0.58 mm and a surface roughness of about 0.3 nm. The sample is thinned and polished to have a thickness of about 0.45 mm and a surface roughness of about 3 nm. The $(Ce_{0.06\%}Gd_{25\%}Y_{74.94\%})_3Al_5O_{12}$ ceramic material is used as a substrate, transferred into a Metal Organic Compound Vapor Deposition apparatus, and cleaned at a temperature of about 1300° C. and a H$_2$ atmosphere for about 15 minutes. The temperature decreases to about 500° C. and then a low temperature AlN buffer layer having a thickness of about 60 nm is grown. The temperature is raised to about 700° C. and a low temperature GaN buffer layer having a thickness of about 50 nm is grown. The temperature is raised up to about 1100° C. and a high temperature GaN buffer layer having a thickness of about 4 μm is grown. The temperature is raised up to about 1200° C. and an n-type GaN layer having a thickness of about 1 μm is grown, in which the doping concentration of Si is about $1.5\times10^{19}$ cm$^{-3}$. The temperature is decreased down to about 850° C. and InGaN/GaN multi quantum well layers are grown for 30 cycles. The temperature is raised up to about 1050° C. and a p-type GaN layer having a thickness of about 500 nm is grown, in which the doping concentration is about $2\times10^{17}$ cm$-3$. The temperature is raised up to about 1180° C. and a heavily doped p-type GaN electrode contacting layer having a thickness of about 15 nm is grown, in which the doping concentration of Mg is about $3\times10^{19}$ cm$^{-3}$. Finally, the deposition apparatus is cooled down to a room temperature. Thus, the GsN based white light LED epitaxial structure according to the present invention is obtained.

According to one aspect of the present invention, a composition of $(Ce_{0.1\%}Gd_{10\%}Y_{29.9\%}Tb_{60\%})_3Al_5O_{12}$ is sintered as a ceramic. The sintered ceramic is thinned to have a thickness of about 0.5 mm and its surface is polished to have a surface roughness of about 10 nm. The commercially available Al$_2$O$_3$ single crystal is polished in both sides to have a surface roughness of about 5 nm at both sides. The $(Ce_{0.1\%}Gd_{10\%}Y_{29.9\%}Tb_{60\%})_3Al_5O_{12}$ ceramic and the Al$_2$O$_3$ single crystal are cleaned in a standard Piranha procedure and dried in vacuum. The surface of the dried $(Ce_{0.1\%}Gd_{10\%}Y_{29.9\%}Tb_{60\%})_3Al_5O_{12}$ ceramic and that of the Al$_2$O$_3$ single crystalline are jointed together at the opposite polished surfaces in a ultra-clean chamber with a vacuity of about $5\times10^{-4}$ Pa. Then the polished substrate are heated by heating equipment up to a temperature of about 200° C. and are bonded for 2 hours. The substrate obtained by bonding the $(Ce_{0.1\%}Gd_{10\%}Y_{29.9\%}Tb_{60\%})_3Al_5O_{12}$ ceramic and the Al$_2$O$_3$ single crystalline is transferred into a Metal Organic Compound Vapor Deposition apparatus and an epitaxial grows occurs by taking the Al$_2$O$_3$ single crystalline as the substrate. The bonded substrate is heated at a temperature of about 1000° C. for about 10 minutes. The temperature decreases to about 400° C. and substrate is nitrogenated to grow a low temperature GaN buffer layer having a thickness of about 60 nm. The temperature is raised up to about 1000° C. and a GaN buffer layer having a thickness of about 4 μm is grown. The system is cooled down and the sample is taken out. Next, a SiO$_2$ layer having a thickness of about 500 nm is deposited on the surface of the GaN layer by a Plasma Enhanced Chemical Vapor Deposition (PECVD) and functions as a mask layer. Next, a long stripe window with a length of about 15 μm and a ratio between the window region and mask region of about 4:1 is etched on the GaN surface along the crystallographic direction by a conventional photolithographic process in conjunction with a dry or wet etching technique. A subsequent laterally epitaxial growing is implemented within the etched rectangular window. The patterned substrate is placed into a Metal Organic Compound Vapor Deposition apparatus, and cleaned at a temperature of about 800° C. and a H$_2$ atmosphere for about 20 minutes. The temperature decreases to about 500° C. and then a low temperature AlN buffer layer having a thickness of about 60 nm is grown. A low temperature GaN buffer layer having a thickness of about 300 nm is grown. The temperature is raised up to about 900° C. and a high temperature GaN buffer layer having a thickness of about 4 μm is grown. The temperature is kept at about 900° C. and an n-type GaN layer having a thickness of about 3 μm is grown, in which the doping concentration of Si is about $1\times10^{17}$ cm$^{-3}$. The temperature is decreased down to about 650° C. and InGaN/GaN multi quantum well layers are grown for 30 cycles. The temperature is raised up to about 800° C. and a p-type GaN layer having a thickness of about 100 nm is grown, in which the doping concentration is about $3\times10^{20}$ cm$^{-3}$. The temperature is kept at about 800° C. and a heavily doped p-type GaN electrode contacting layer having a thickness of about 50 nm is grown, in which the doping concentration of Mg is about $5\times10^{20}$ cm$^{-3}$. Finally, the deposition apparatus is cooled down to a room temperature. Thus, the GsN based white light LED epitaxial structure is obtained.

According to one aspect of the present invention, a composition of $(Ce_{0.06\%}Gd_{25\%}Y_{74.94\%})_3Al_5O_{12}$ is sintered as a ceramic. The sample is thinned and polished to have a thickness of about 0.3 mm and a surface roughness of about 3 nm. Then the polished substrate is transferred into a Metal Organic Compound Vapor Deposition apparatus and is heated at a temperature of about 1200° C. for about 5 minutes. The temperature decreases to about 700° C. and substrate is nitrogenated to grow a low temperature GaN buffer layer having a thickness of about 15 nm. The temperature is raised up to about 1200° C. and a GaN buffer layer having a thickness of about 100 nm is grown. The temperature is decreased to 1000° C. and an n-type GaN layer having a thickness of about 550 nm is grown, in which the doping concentration of Si is about $1\times10^{17}$ cm$^{-3}$. The system is cooled down and the sample is taken out. Next, a SiO$_2$ layer having a thickness of about 50 nm is deposited on the surface of the GaN layer by a Plasma Enhanced Chemical Vapor Deposition (PECVD) and functions as a mask layer. Next, a long stripe window with a length of about 2 μm and a ratio between the window region and mask region of about 1:4 is etched on the GaN surface along the crystallographic direction by a conventional photolithographic process in conjunction with a dry or wet etching technique. The patterned substrate is placed into a Metal Organic Compound Vapor Deposition apparatus, and cleaned at a temperature of about 1400° C. and a $H_2$ atmosphere for about 5 minutes. The temperature decreases to about 700° C. and then a low temperature AlN buffer layer having a thickness of about 200 nm is grown. A low temperature GaN buffer layer having a thickness of about 800 nm is grown. The temperature is raised up to about 900° C. and a high temperature GaN buffer layer having a thickness of about 4 μm is grown. The temperature is decreased to 1000° C. and an n-type GaN layer having a thickness of about 3 μm is grown, in which the doping concentration of Si is about $2\times10^{19}$ cm$^{-3}$. The temperature is decreased down to about 750° C. and InGaN/GaN multi quantum well layers are grown for 20 cycles. The temperature is raised up to about 1000° C. and a p-type GaN layer having a thickness of about 300 nm is grown, in which the doping concentration is about $4\times10^{19}$ cm$^{-3}$. The temperature is kept at about 1000° C. and a heavily doped p-type GaN electrode contacting layer having a thickness of about 35 nm is grown, in which the doping concentration of Mg is about $4\times20$ cm$^{-3}$. Finally, the deposition apparatus is cooled down to a room temperature. Thus, the GsN based white light LED epitaxial structure is obtained.

As can be seen from the above mentioned aspects, the rare earth element doped Yttrium Aluminum Garnet series $Re_3Al_5O_{12}$ substrate comprises a $Re_xA_{(3-x)}Al_5O_{12}$ Yttrium Aluminum Garnet series substrate, and A is a lanthanide series element in addition, the element of A may comprises Y, Lu or Ga.

Although the embodiments disclosed by the present invention are shown as mentioned above, the described contents are not used to limit the present invention, but to facilitate understanding of the present invention. Any modification and changes may be made in form or in detail for those skilled in the art without departing from the spirit and scope of the present invention. The scope of the present invention is only limited by the accompany claims.

What is claimed is:

1. A GaN based LED epitaxial structure comprising:
a substrate; and
a GaN based LED epitaxial structure on the substrate,
wherein the substrate is a substrate containing a photoluminescence fluorescent material, and the substrate containing photoluminescence fluorescent material is a polycrystalline $Re_3Al_5O_{12}$ ceramic substrate or a textured $Re_3Al_5O_{12}$ ceramic substrate.

2. The GaN based LED epitaxial structure according to claim 1, wherein the substrate comprises a rare earth element doped Yttrium Aluminum Garnet series $Re_3Al_5O_{12}$ substrate.

3. The GaN based LED epitaxial structure according to claim 2, wherein the substrate comprises a substrate obtained by bonding the rare earth element doped $Re_3Al_5O_{12}$ substrate with an $Al_2O_3$ substrate.

4. The GaN based LED epitaxial structure according to claim 2, wherein the rare earth element Re in the rare earth element doped Yttrium Aluminum Garnet series $Re_3Al_5O_{12}$ substrate comprises a material selected from a group consisting of Ce, Gd, Eu, Er, Nd, Tb, Sm, Tm, Dy and Yb, or combinations thereof.

5. The GaN based LED epitaxial structure according to claim 4, wherein the rare earth element doped Yttrium Aluminum Garnet series $Re_3Al_5O_{12}$ substrate comprises a $Re_xA_{(3-x)}Al_5O_{12}$ substrate, and A is a lanthanide series element.

6. The GaN based LED epitaxial structure according to claim 5, wherein A comprises Y, Lu or Ga.

7. The GaN based LED epitaxial structure according to claim 1, wherein the substrate comprises a substrate with a surface roughness lower than 10 nm which is obtained by a fine polishing.

8. The GaN based LED epitaxial structure according to claim 1, wherein the GaN based LED epitaxial structure comprises in turn a low temperature AlN buffer layer, a low temperature GaN buffer layer, a GaN buffer layer, an n-type GaN layer, an AlGaN barrier layer, an InGaN/GaN multi quantum well lighting layer, an AlGaN barrier layer, a P type GaN layer and a heavily doped P type GaN electrode contact layer.

9. The GaN based LED epitaxial structure according to claim 1, wherein the GaN based LED epitaxial structure comprises a GaN based LED epitaxial structure which is laterally epitaxial grown on a pattered rare earth element doped $Re_3Al_5O_{12}$ ceramic substrate, a single crystalline substrate or a bonded substrate.

10. A method for manufacturing the GaN based LED epitaxial structure of claim 1, comprising the steps of:
preparing a substrate containing a photoluminescence fluorescent material that is a polycrystalline $Re_3Al_5O_{12}$ ceramic substrate or a textured $Re_3Al_5O_{12}$ ceramic substrate; and
epitaxially growing a GaN based LED epitaxial structure on the substrate.

11. The method according to claim 10, wherein the substrate comprises a rare earth element doped Yttrium Aluminum Garnet series $Re_3Al_5O_{12}$ substrate.

12. The method according to claim 11, prior to epitaxially growing, further comprising a step of bonding the rare earth element doped $Re_3Al_5O_{12}$ substrate with an $Al_2O_3$ substrate.

13. The method according to claim 12, further comprising:
patterning the rare earth element doped $Re_3Al_5O_{12}$ ceramic substrate, a single crystalline substrate or a bonded substrate; and
laterally epitaxially growing a GaN based LED epitaxial structure on the patterned substrate.

14. The method according to claim 11, wherein the rare earth element comprises a material selected from a group consisting of Ce, Gd, Eu, Er, Nd, Tb, Sm, Tm, Dy and Yb, or combinations thereof.

15. The method according to claim 14, wherein the rare earth element doped Yttrium Aluminum Garnet series $Re_3Al_5O_{12}$ substrate comprises a $Re_xA_{(3-x)}Al_5O_{12}$ substrate, and A is a lanthanide series element.

16. The method according to claim 15, wherein A comprises Y, Lu or Ga.

17. The method according to claim 10, prior to epitaxially growing, further comprising a step of fine polishing the prepared substrate so that it has a surface roughness lower than 10 nm.

18. The method according to claim 10, wherein the GaN based LED epitaxial structure comprises in turn a low temperature AlN buffer layer, a low temperature GaN buffer layer, a GaN buffer layer, an n-type GaN layer, an AlGaN barrier layer, an InGaN/GaN multi quantum well lighting layer, an AlGaN barrier layer, a P type GaN layer and a heavily doped P type GaN electrode contact layer.

19. The method according to claim 10, the step of preparing a substrate containing a photoluminescence fluorescent material comprising:
- mixing powder of the photoluminescence fluorescent material together;
- cold press molding the mixed powder into an embryo;
- sintering the embryo; and
- thinning and fine polishing the transparent sintered ceramic sample so as to obtain the substrate containing a photoluminescence fluorescent.

* * * * *